United States Patent
Li et al.

(10) Patent No.: US 11,347,148 B2
(45) Date of Patent: May 31, 2022

(54) PATTERNING METHOD AND METHOD FOR MANUFACTURING ARRAY SUBSTRATE

(71) Applicants: BOE Technology Group Co., Ltd., Beijing (CN); Hefei Xinsheng Optoelectronics Technology Co., Ltd., Anhui (CN)

(72) Inventors: Wei Li, Beijing (CN); Bin Zhou, Beijing (CN); Jun Liu, Beijing (CN); Ning Liu, Beijing (CN); Yang Zhang, Beijing (CN); Yingbin Hu, Beijing (CN)

(73) Assignees: BOE Technology Group Co., Ltd., Beijing (CN); Hefei Xinsheng Optoelectronics Technology Co., Ltd., Anhui (CN)

( * ) Notice: Subject to any disclaimer, the term of this patent is extended or adjusted under 35 U.S.C. 154(b) by 893 days.

(21) Appl. No.: 16/086,990

(22) PCT Filed: Feb. 12, 2018

(86) PCT No.: PCT/CN2018/076373
§ 371 (c)(1),
(2) Date: Sep. 20, 2018

(87) PCT Pub. No.: WO2019/015317
PCT Pub. Date: Jan. 24, 2019

(65) Prior Publication Data
US 2021/0200090 A1    Jul. 1, 2021

(30) Foreign Application Priority Data
Jul. 17, 2017  (CN) .......................... 201710581717.3

(51) Int. Cl.
*G03F 7/09*  (2006.01)
*G03F 7/20*  (2006.01)
(Continued)

(52) U.S. Cl.
CPC ............ *G03F 7/094* (2013.01); *G03F 7/0007* (2013.01); *G03F 7/039* (2013.01); *G03F 7/426* (2013.01);
(Continued)

(58) Field of Classification Search
CPC ........ G03F 7/094; G03F 7/0007; G03F 7/039; G03F 7/426; G03F 7/70008;
(Continued)

(56) References Cited

U.S. PATENT DOCUMENTS

2002/0047121 A1   4/2002  Sakamoto
2004/0127056 A1   7/2004  Kim et al.
(Continued)

FOREIGN PATENT DOCUMENTS

CN    103399468 A    11/2013
CN    103995441 A    8/2014
(Continued)

OTHER PUBLICATIONS

Apr. 19, 2018—(WO) International Search Report and the Written Opinion Appn PCT/CN2018/076373 with English Translation.
(Continued)

*Primary Examiner* — Caleen O Sullivan
(74) *Attorney, Agent, or Firm* — Banner & Witcoff, Ltd.

(57) ABSTRACT

A patterning method and a method for manufacturing an array substrate are provided, and the patterning method includes: forming a photolithography auxiliary film and a positive photoresist film in turn on a base substrate provided with a layer to be patterned; subjecting the photolithography auxiliary film and the positive photoresist film to a photolithography process to form a photolithography auxiliary layer pattern and a positive photoresist pattern; patterning the layer to be patterned; and UV irradiating the photolithography auxiliary layer pattern and the positive photoresist
(Continued)

pattern and then removing the photolithography auxiliary layer pattern and the positive photoresist pattern.

19 Claims, 6 Drawing Sheets

(51) Int. Cl.
| | | |
|---|---|---|
| G03F 7/42 | (2006.01) | |
| G03F 7/00 | (2006.01) | |
| G03F 7/039 | (2006.01) | |
| H01L 27/12 | (2006.01) | |

(52) U.S. Cl.
CPC ...... *G03F 7/70008* (2013.01); *H01L 27/1288* (2013.01)

(58) Field of Classification Search
CPC ........ G03F 7/0233; G03F 7/425; G03F 7/167; G03F 7/40; G03F 7/095; G03F 7/2004; G03F 7/26; G03F 7/42; H01L 27/1288; G02F 1/1362
USPC ............................. 438/158; 430/311, 270.1
See application file for complete search history.

(56) References Cited

U.S. PATENT DOCUMENTS

| | | |
|---|---|---|
| 2014/0363565 A1 | 12/2014 | Liu et al. |
| 2016/0154315 A1 | 6/2016 | Liu |
| 2016/0238943 A1 | 8/2016 | Zhang |
| 2016/0284559 A1* | 9/2016 | Kikuchi .............. H01L 21/0332 |
| 2017/0236837 A1 | 8/2017 | Cai et al. |

FOREIGN PATENT DOCUMENTS

| | | |
|---|---|---|
| CN | 104216230 A | 12/2014 |
| CN | 104730864 A | 6/2015 |
| CN | 105097840 A | 11/2015 |
| CN | 106687865 A | 5/2017 |
| CN | 107422605 A | 12/2017 |
| TW | 394986 B | 6/2000 |

OTHER PUBLICATIONS

Jul. 22, 2019—(CN) First Office Action Appn 201710581717.3 with English Translation.

* cited by examiner

PATTERNING METHOD AND METHOD FOR MANUFACTURING ARRAY SUBSTRATE

The application is a U.S. National Phase Entry of International Application No. PCT/CN2018/076373 filed on Feb. 12, 2018, designating the United States of America and claiming priority to Chinese Patent Application No. 201710581717.3 filed on Jul. 17, 2017. The present application claims priority to and the benefit of the above-identified applications and the above-identified applications are incorporated by reference herein in their entirety.

TECHNICAL FIELD

At least one embodiment of the present disclosure relates to a patterning method and a method for manufacturing an array substrate.

BACKGROUND

In the manufacture of a liquid crystal display (LCD), a light emitting diode (LED), an organic light emitting diode (OLED) and other devices, their components such as a black matrix, a pixel electrode and a light-emitting layer are generally prepared by a patterning method which comprises applying, exposing, developing and etching a photoresist. The developing process is mainly used to remove the residual photoresist on the base substrate after exposure and to preform the required mask pattern for the next etching process.

SUMMARY

At least one embodiment of the present disclosure provides a patterning method, and the patterning method comprises: forming a photolithography auxiliary film and a positive photoresist film in turn on a base substrate provided with a layer to be patterned; subjecting the photolithography auxiliary film and the positive photoresist film to a photolithography process to form a photolithography auxiliary layer pattern and a positive photoresist pattern; patterning the layer to be patterned through the photolithography auxiliary layer pattern and the positive photoresist pattern; and UV irradiating the photolithography auxiliary layer pattern and the positive photoresist pattern and then removing the photolithography auxiliary layer pattern and the positive photoresist pattern.

For example, in the patterning method provided by at least one embodiment of the present disclosure, the photolithography auxiliary layer pattern and the positive photoresist pattern have a same shape.

For example, in the patterning method provided by at least one embodiment of the present disclosure, the layer to be patterned is an inorganic insulating layer, an organic insulating layer or a composite insulating layer, and the composite insulating layer comprises an inorganic insulating layer and an organic insulating layer formed sequentially on the base substrate.

For example, in the patterning method provided by at least one embodiment of the present disclosure, the photolithography process comprises exposing and developing the photolithography auxiliary film and the positive photoresist film to remove those exposed portions of the photolithography auxiliary film and the positive photoresist film.

For example, in the patterning method provided by at least one embodiment of the present disclosure, the photolithography auxiliary layer pattern comprises at least one material of: spiropyran compounds

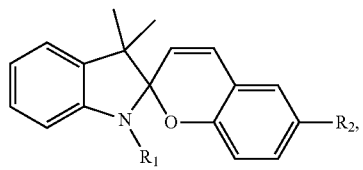

spiroxazine compounds

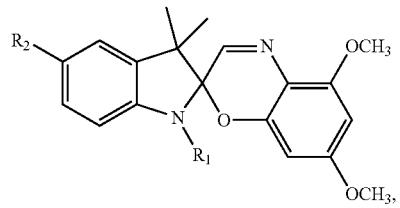

aziridine compounds

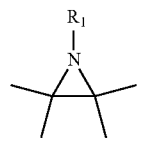

and bipyridine compounds

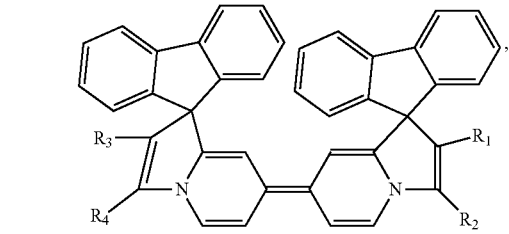

wherein $R_1$ and $R_3$ are independently propyl, butyl, amyl, hexyl, phenyl or an ether chain; $R_2$ and $R_4$ are independently carboxyl or hydroxyl.

For example, in the patterning method provided by at least one embodiment of the present disclosure, the spiropyran compounds are subjected to a following reaction under UV light to reduce adhesion between the photolithography auxiliary layer pattern and the layer to be patterned:

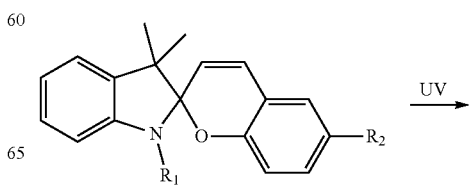

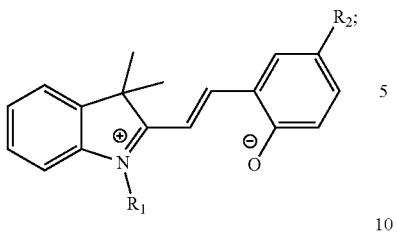

the spirooxazine compounds are subjected to a following reaction under UV light to reduce adhesion between the photolithography auxiliary layer pattern and the layer to be patterned:

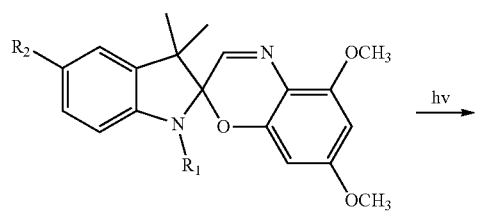

the aziridine compounds are subjected to a following reaction under UV light to reduce adhesion between the photolithography auxiliary layer pattern and the layer to be patterned:

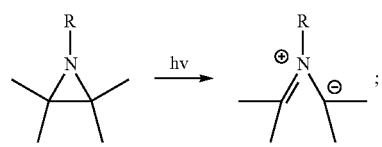

the bipyridine compounds are subjected to a following reaction under UV light to reduce adhesion between the photolithography auxiliary layer pattern and the layer to be patterned:

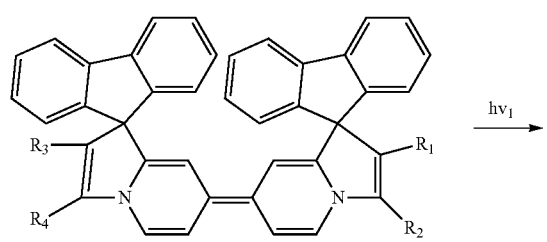

For example, in the patterning method provided by at least one embodiment of the present disclosure, the photolithography auxiliary layer pattern comprises a material of N-butyl-6-hydroxyl spiropyran

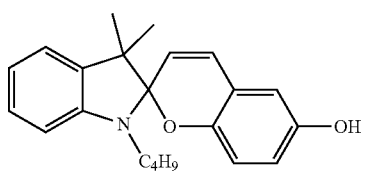

or N-butyl-5'-carboxyl-5,7-dimethoxy-spirobenzoxazine

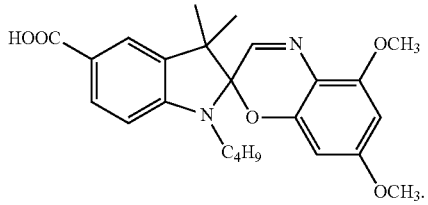

For example, in the patterning method provided by at least one embodiment of the present disclosure, the photolithography auxiliary film is formed by an evaporation process.

For example, in the patterning method provided by at least one embodiment of the present disclosure, patterning the layer to be patterned comprises forming a via hole structure in the layer to be patterned by a plasma dry etching process.

For example, in the patterning method provided by at least one embodiment of the present disclosure, the gas for forming the plasma includes any one or more combinations of carbon tetrafluoride and oxygen, carbon tetrafluoride and nitrogen, sulfur hexafluoride and oxygen, and sulfur hexafluoride and nitrogen.

For example, in the patterning method provided by at least one embodiment of the present disclosure, the organic insulating layer is made from a mixture of 10 wt % to 20 wt % of polymethyl methacrylate resin, 1 wt % to 5 wt % of an unsaturated monomer molecule, 0.1 wt % to 1 wt % of a photoinitiator, 0.1 wt % to 1 wt % of an additive(s), and 75 wt % to 90 wt % of an organic solvent.

For example, in the patterning method provided by at least one embodiment of the present disclosure, the UV light employed to irradiate the photolithography auxiliary layer pattern and the positive photoresist pattern has an intensity of 1 mW/cm$^2$ to 10 mW/cm$^2$.

For example, in the patterning method provided by at least one embodiment of the present disclosure, removing the photolithography auxiliary layer pattern and the positive photoresist pattern is achieved by a stripping solution which comprises 10 wt % to 30 wt % of monoethanolamine (MEA), 40 wt % to 70 wt % of diethylene glycol monobutyl ether and 10 wt % to 40 wt % of dimethyl sulfoxide (DMSO).

For example, in the patterning method provided by at least one embodiment of the present disclosure, the positive photoresist pattern is made from a mixture of 5 wt % to 30 wt % of phenolic resin, 2 wt % to 5 wt % of a diazonaphthaquinone photosensitizer, 0.1 wt % to 1 wt % of an additive(s), and 65 wt % to 80 wt % of an organic solvent.

At least one embodiment of the present disclosure further provides a method for manufacturing an array substrate, and the manufacturing method comprises: forming a photolithography auxiliary film and a positive photoresist film in turn on a base substrate provided with a layer to be patterned; subjecting the photolithography auxiliary film and the positive photoresist film to a photolithography process to form a photolithography auxiliary layer pattern and a positive photoresist pattern; patterning the layer to be patterned through the photolithography auxiliary layer pattern and the positive photoresist pattern; and UV irradiating the photolithography auxiliary layer pattern and the positive photoresist pattern, and then removing the photolithography auxiliary layer pattern and the positive photoresist pattern.

For example, in the manufacturing method provided by at least one embodiment of the present disclosure, the photolithography auxiliary layer pattern comprises at least one material of: spiropyran compounds

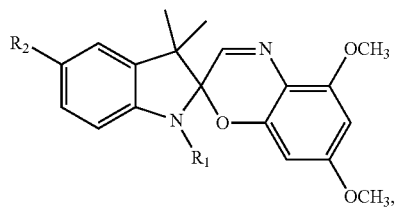

of: spirooxazine compounds

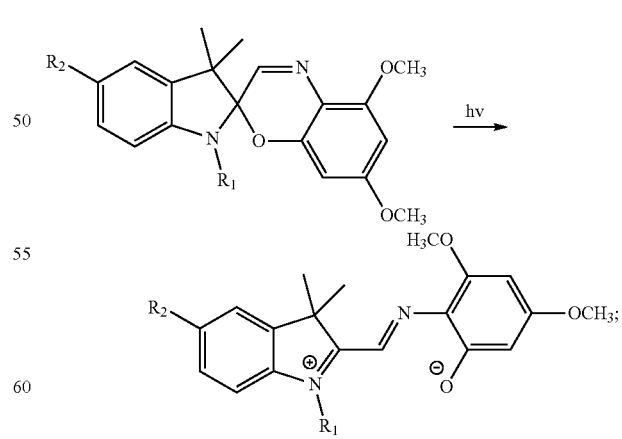

aziridine compounds

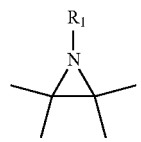

and
bipyridine compounds

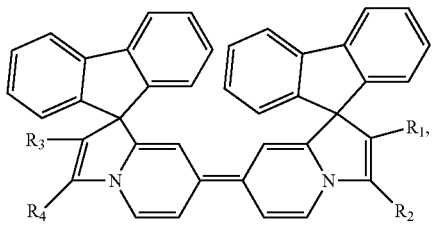

wherein $R_1$ and $R_3$ are independently propyl, butyl, amyl, hexyl, phenyl or an ether chain; $R_2$ and $R_4$ are independently carboxyl or hydroxyl.

For example, in the manufacturing method provided by at least one embodiment of the present disclosure, the spiropyran compounds are subjected to a following reaction under UV light to reduce adhesion between the photolithography auxiliary layer pattern and the layer to be patterned

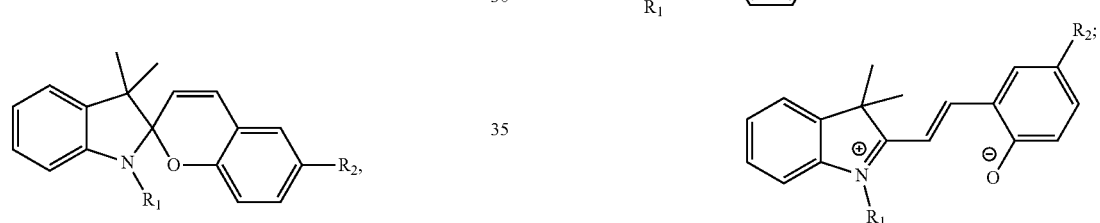

the spirooxazine compounds are subjected to a following reaction under UV light to reduce adhesion between the photolithography auxiliary layer pattern and the layer to be patterned:

the aziridine compounds are subjected to a following reaction under UV light to reduce adhesion between the photolithography auxiliary layer pattern and the layer to be patterned:

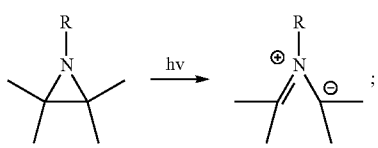

the bipyridine compounds are subjected to a following reaction under UV light to reduce adhesion between the photolithography auxiliary layer pattern and the layer to be patterned:

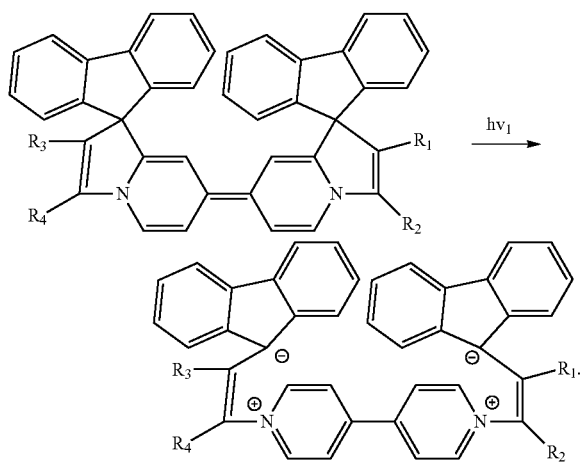

For example, in the manufacturing method provided by at least one embodiment of the present disclosure, the photolithography auxiliary layer pattern comprises a material of N-butyl-6-hydroxyl spiropyran

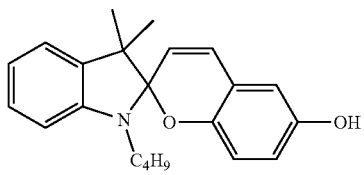

or N-butyl-5'-carboxyl-5,7-dimethoxy-spirobenzoxazine

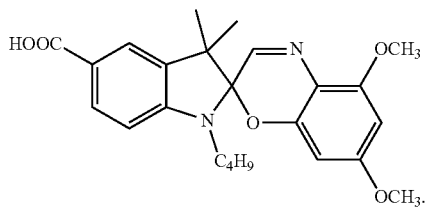

For example, in the manufacturing method provided by at least one embodiment of the present disclosure, patterning the layer to be patterned comprises forming a via hole structure in the layer to be patterned by a plasma dry etching process.

For example, the manufacturing method provided by at least one embodiment of the present disclosure further comprises: forming a first electrode on the layer to be patterned after the photolithography auxiliary layer pattern and the positive photoresist pattern have been removed.

For example, the manufacturing method provided by at least one embodiment of the present disclosure further comprises: forming a thin film transistor on the base substrate before providing the base substrate with the layer to be patterned, wherein the thin film transistor comprises a first source drain electrode which is electrically connected with the first electrode by the via hole structure.

BRIEF DESCRIPTION OF THE DRAWINGS

In order to clearly illustrate the technical solution of the embodiments of the present disclosure, the drawings of the embodiments will be briefly described in the following. It is obvious that the described drawings are only related to some embodiments of the present disclosure and thus are not limitative of the present disclosure.

DETAILED DESCRIPTION

Figure 1:
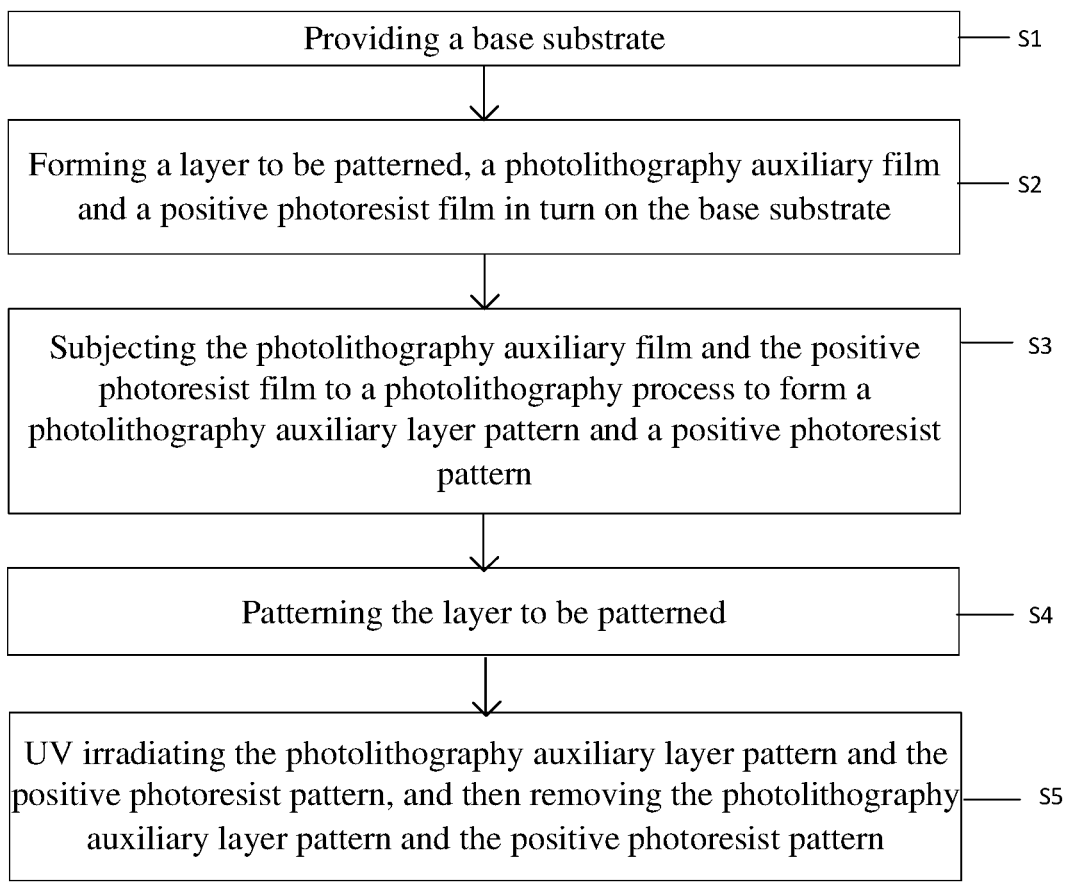
FIG. 1 is a flow chart of a patterning method provided by an embodiment of the present disclosure.

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

In a process of manufacturing an array substrate, photolithography is an indispensable process and plays a role of transferring the pattern. In general, a film to be patterned formed on a base substrate needs to be cleaned, and then is coated with a photoresist. After pre-baking, exposing, developing and post-baking the photoresist to form a mask pattern, the film to be patterned is etched by using the photoresist as a mask, and the photoresist is stripped to form a target pattern. A main component of the photoresist is a polymer having a photosensitive group. Under the irradiation of ultraviolet light, the photosensitive group will change its structure, which results in different solubility between the photosensitive portion and the non-photosensitive portion of the photoresist in a developing solution, so that the pattern is transferred after developing.

For example, an organic film is usually applied on the inorganic passivation layer (PVX) to play roles of protection and planarization, and an electrode is formed on the organic film to connect with a source electrode or a drain electrode of a thin film transistor. In this way, a via hole structure needs to be formed in the organic film. The photoresist is applied directly on the organic film provided with the via hole structure. Applying the photoresist directly on the organic film having a similar polarity with the photoresist would lead to a large adhesion formed between the photoresist and the organic film. As such, after the etching process is completed, a problem that the photoresist is difficult to be removed from the via hole structure would readily occur, that is, the phenomenon of photoresist residue would occur. The residual photoresist would reduce the yield of a substrate and the display quality of the display device based on the substrate.

At least one embodiment of the present disclosure provides a patterning method and a method for manufacturing an array substrate, the patterning method and the method for manufacturing the array substrate comprise: forming a photolithography auxiliary film and a positive photoresist film in turn on a base substrate provided with a layer to be patterned; subjecting the photolithography auxiliary film and the positive photoresist film to a photolithography process to form a photolithography auxiliary layer pattern and a positive photoresist pattern; patterning the layer to be patterned through the photolithography auxiliary layer pattern and the positive photoresist pattern; and UV irradiating the photolithography auxiliary layer pattern and the positive photoresist pattern, and then removing the photolithography auxiliary layer pattern and the positive photoresist pattern. The patterning method and the method for manufacturing the array substrate avoid the residue of the photoresist by designing the photolithography auxiliary layer pattern. That is, the photolithography auxiliary film is applied before applying the photoresist, and the UV illumination unit is added to change the adhesion between the photolithography auxiliary layer pattern and the layer to be patterned before the photoresist is stripped by using a stripping solution. In this way, the photolithography auxiliary layer pattern can be stripped easily, which promotes the positive photoresist to be stripped easily. As such, the yield of the array substrate is improved, and the display quality of the display devices such as LCD, LED and OLED based on the array substrate is improved.

At least one embodiments of the present disclosure provides a patterning method, for example, FIG. 1 is a flow chart of a patterning method provided by an embodiment of the present disclosure. The patterning method includes the following operations of S1 to S5:

Step S1: providing a base substrate.

For example, the base substrate is a glass substrate, a quartz substrate, or a plastic substrate, etc., that is, the base substrate may be a flexible substrate or a rigid substrate. For example, the flexible substrate is made of PI, PET, PEN, PES, PU, PMMA, PC, ultra-thin glass, or metal foil, or is a composite flexible substrate containing the above materials. The rigid substrate is made of glass, metal plate, thick plastic plate, or glass fiber reinforced plastic composite plate.

Step S2: forming a layer to be patterned, a photolithography auxiliary film and a positive photoresist film in turn on the base substrate.

For example, the layer to be patterned may be an insulating layer. The insulating layer is an inorganic insulating layer, an organic insulating layer or a composite insulating layer, and the composite insulating layer may comprise an inorganic insulating layer and an organic insulating layer formed sequentially on the base substrate.

It should be noted that, the layer to be patterned may be other layers, such as a passivation layer and a pixel definition layer, from which the positive photoresist can be easy to be removed.

For example, the inorganic insulating material may include a material of silicon nitride ($SiN_x$), silicon oxide ($SiO_x$) or silicon oxynitride ($SiNO_x$).

For example, the organic insulating layer may be made from a mixture of 10 wt % to 20 wt % of polymethyl methacrylate resin, 1 wt % to 5 wt % of an unsaturated monomer molecule, 0.1 wt % to 1 wt % of a photoinitiator, 0.1 wt % to 1 wt % of an additive(s), and 75 wt % to 90 wt % of an organic solvent. The organic insulating layer may have the properties of a negative photoresist.

For example, the organic insulating layer may be made from a mixture of 15 wt % of polymethyl methacrylate resin, 4 wt % of an unsaturated monomer molecule, 0.5 wt % of a photoinitiator, 0.5 wt % of an additive(s), and 80 wt % of an organic solvent.

For example, the resin material in the organic insulating layer may be replaced by other resin materials including but not limited to acrylic resin, phenolic resin, polyimide resin or PVC resin.

It should be noted that, the material of the photolithography auxiliary layer corresponding to the organic insulating layer may be different from the material of the photolithography auxiliary layer corresponding to the inorganic insulating layer. As such, the material of the corresponding photolithography auxiliary layer may be selected according to the polarity of the organic insulating layer or the inorganic insulating layer. For example, the following is illustrated by an example that an insulating layer in contact with a lithographic auxiliary layer is an organic insulating layer.

For example, the photoresist auxiliary film may be formed by an evaporation process or a plasma deposition process.

For example, the positive photoresist film may be formed by a spin coating process, a plane moving coating process and so on.

Step S3: subjecting the photolithography auxiliary film and the positive photoresist film to a photolithography process to form a photolithography auxiliary layer pattern and a positive photoresist pattern.

For example, in the patterning method provided by at least one embodiment of the present disclosure, the photolithography auxiliary layer pattern comprises at least one material of: spiropyran compounds

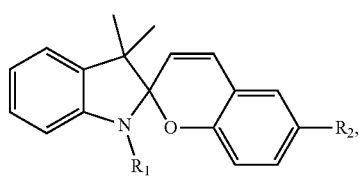

spirooxazine compounds

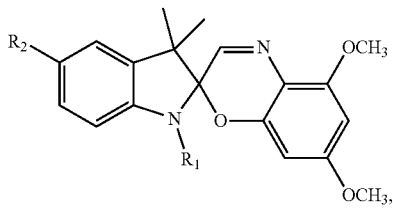

aziridine compounds

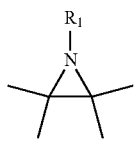

and
compounds

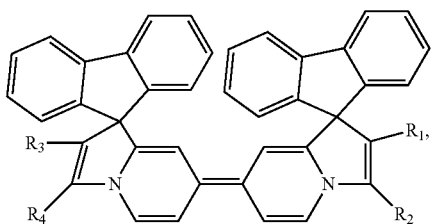

wherein $R_1$ and $R_3$ are independently propyl, butyl, amyl, hexyl, phenyl or an ether chain; $R_2$ and $R_4$ are independently carboxyl or hydroxyl.

For example, in the patterning method provided by at least one embodiment of the present disclosure, the photolithography auxiliary layer pattern comprises a material of N-butyl-6-hydroxy spiropyran

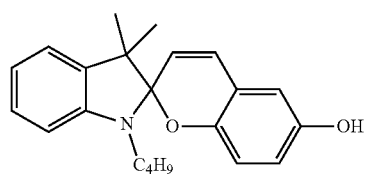

or N-butyl-5'-carboxyl-5,7-dimethoxy-spirobenzoxazine

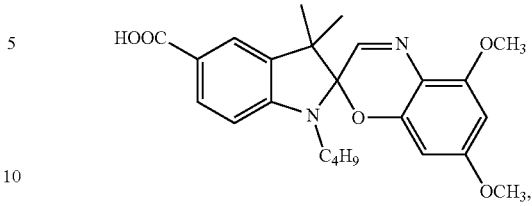

etc.

For example, the above materials of the photolithography auxiliary layer pattern have ring structures which allow a ring opening reaction to occur under ultraviolet light irradiation to change the polarity of the materials of the photolithography auxiliary layer pattern. As such, the degree of adhesion between the photolithography auxiliary layer pattern and the layer to be patterned (for example, an insulating layer) is changed, so as to facilitate the photoresist to be stripped.

For example, the positive photoresist pattern is made from a mixture of 5 wt % to 30 wt % of phenolic resin, 2 wt % to 5 wt % of a diazonaphthaquinone photosensitizer, 0.1 wt % to 1 wt % of an additive(s), and 65 wt % to 80 wt % of an organic solvent.

For example, the positive photoresist pattern is made from a mixture of 25 wt % of phenolic resin, 3.5 wt % of a diazonaphthaquinone photosensitizer, 0.5 wt % of an additive(s), and 71 wt % of an organic solvent.

For example, the photolithography process comprises exposing and developing the photolithography auxiliary film and the positive photoresist film to remove those exposed portions of the photolithography auxiliary film and the positive photoresist film for providing a mask pattern for the subsequent patterning process of the layer to be patterned.

Step S4: Patterning the Layer to be Patterned.

For example, patterning the layer to be patterned comprises forming a via hole structure in the layer to be patterned by a plasma dry etching process to form the pattern of the layer to be patterned.

For example, the gases for forming the plasma in the process of patterning the layer to be patterned (for example, the insulating layer) include one or more combinations of carbon tetrafluoride and oxygen, carbon tetrafluoride and nitrogen, sulfur hexafluoride and oxygen, and sulfur hexafluoride and nitrogen.

Step S5: UV irradiating the photolithography auxiliary layer pattern and the positive photoresist pattern, and then removing the photolithography auxiliary layer pattern and the positive photoresist pattern.

For example, the ring opening reaction of the spiropyran compound occurs under ultraviolet light as follows. As such, the photolithography auxiliary layer pattern is changed, which reduces the adhesion between the photolithography auxiliary layer pattern and the layer to be patterned:

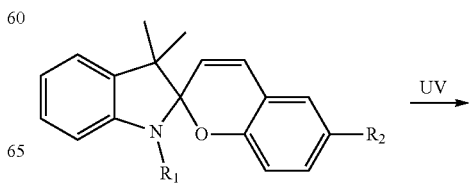

-continued

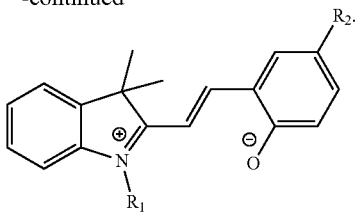

The mechanism of the above reaction is as follows: under the irradiation of ultraviolet light, a C—O bond in the C—O ring breaks, and a C=N double bond is formed in the adjacent C—N ring, and a nitrogen cation and an oxygen anion are also formed, thereby changing the polarity of the photolithography auxiliary layer pattern.

For example, the ring opening reaction of the spiraoxazine compound occurs under ultraviolet light as follows. As such, the photolithography auxiliary layer pattern is changed, which reduces the adhesion between the photolithography auxiliary layer pattern and the layer to be patterned:

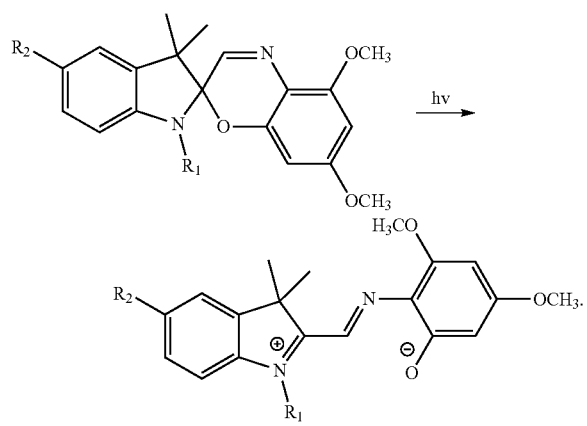

The mechanism of the above reaction is as follows: under the irradiation of ultraviolet light, a C—O bond in the C—O ring breaks, and a C=N double bond is formed in the adjacent C—N ring, and a nitrogen cation and an oxygen anion are also formed, thereby changing the polarity of the photolithography auxiliary layer pattern.

For example, the aziridine compound is subjected to a following reaction under UV light to reduce the adhesion between the photolithography auxiliary layer pattern and the layer to be patterned:

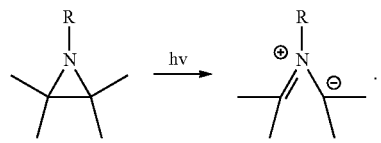

The mechanism of the above reaction is as follows: under the irradiation of ultraviolet light, a C—N bond of the C—N ring breaks, and a C=N double bond is formed, and a nitrogen cation and a carbon anion are also formed, thereby changing the polarity of the photolithography auxiliary layer pattern.

For example, the bipyridine compound is subjected to a following reaction under UV light to reduce the adhesion between the photolithography auxiliary layer pattern and the layer to be patterned:

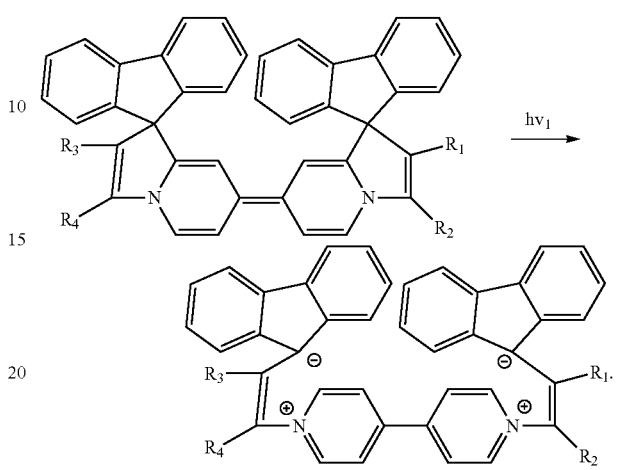

The mechanism of the above reaction is as follows: under the irradiation of ultraviolet light, a C—C bond of the left C-N ring and a C—C bond of the right C—N ring break, and C=N double bonds are formed in the adjacent C—N rings, and nitrogen cations and carbon anions are also formed, thereby changing the polarity of the photolithography auxiliary layer pattern.

For example, the principle of changing the adhesion between the photolithography auxiliary layer pattern and the layer to be patterned by ultraviolet light is as follows: the photolithography auxiliary layer pattern is made of a photoisomerization compound, which would change its structure and polarity under the irradiation of ultraviolet light. The compound is subjected to a ring opening reaction under the irradiation of ultraviolet light to form a polar ionic trans-structure, which leads to the reduction in adhesion between the organic film and the photoresist and avoids the phenomenon of the photoresist residue.

It should be noted that, the polar ionic trans-structure means that it has two large groups located on opposing sides of a double bond, and has a certain polarity and a positive ion and a negative ion.

For example, the UV light employed to irradiate the photolithography auxiliary layer pattern and the positive photoresist pattern may have an intensity of from 1 mW/cm$^2$ to 10 mW/cm$^2$. For example, more specifically, the UV light has an intensity of 2 mW/cm$^2$, 4 mW/cm$^2$, 6 mW/cm$^2$, 8 mW/cm$^2$ or 10 mW/cm$^2$.

For example, after the photolithography auxiliary layer pattern and the positive photoresist pattern are irradiated by UV light, the photolithography auxiliary layer pattern and the positive photoresist pattern are removed by using a stripping solution.

For example, the stripping solution may comprise 10 wt % to 30 wt % of monoethanolamine (MEA), 40 wt % to 70 wt % of diethylene glycol monobutyl ether and 10 wt % to 40 wt % of dimethyl sulfoxide (DMSO).

For example, the stripping solution may comprise 20 wt % of monoethanolamine (MEA), 60 wt % of diethylene glycol monobutyl ether and 20 wt % of dimethyl sulfoxide (DMSO).

Figure 2:
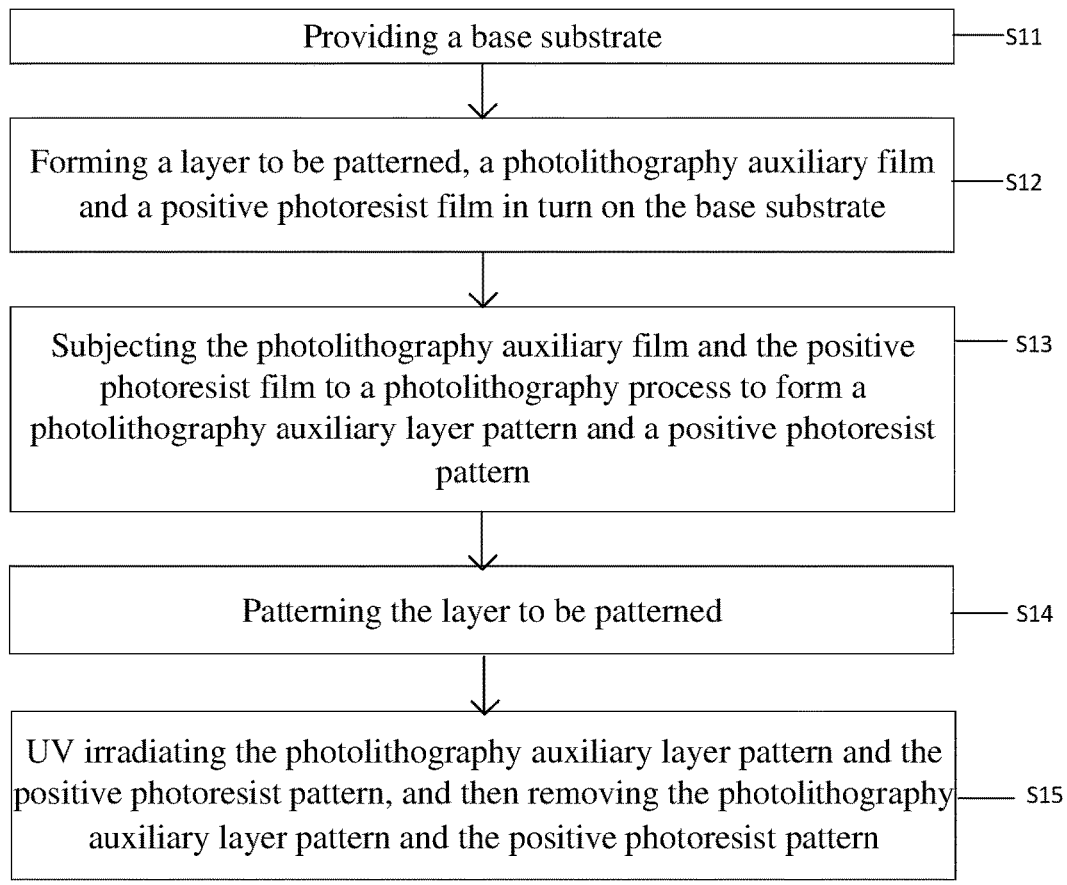
FIG. 2 is a flow chart of a manufacturing method of an array substrate provided by an embodiment of the present disclosure.

For example, FIG. 2 is a flow chart of a manufacturing method of an array substrate provided by an embodiment of the present disclosure, and the manufacturing method comprises the following operations of S11~S15:

Step S11: provide a base substrate.

Step S12: forming a layer to be patterned, a photolithography auxiliary film and a positive photoresist film in turn on the base substrate.

Step S13: subjecting the photolithography auxiliary film and the positive photoresist film to a photolithography process to form a photolithography auxiliary layer pattern and a positive photoresist pattern.

Step S14: patterning the layer to be patterned.

Step S15: UV irradiating the photolithography auxiliary layer pattern and the positive photoresist pattern, and then removing the photolithography auxiliary layer pattern and the positive photoresist pattern.

The detailed preparation processes of the manufacturing method of the array substrate and the materials used in each steps may refer to the former description, which are omitted here.

For example, in the manufacturing method of the array substrate, a pixel circuit may be formed on the base substrate before the layer to be patterned is formed. For example, the pixel circuit may comprise a thin film transistor, and may further comprise gate lines, data lines, etc. For example, a first electrode is formed on the layer to be patterned (for example, an insulating layer) after the photolithography auxiliary layer pattern and the positive photoresist pattern are removed. For example, the first electrode is electrically connected with the first source/drain electrode of the thin film transistor by a via hole structure formed in the insulating layer.

For example, after the first electrode is formed, a passivation layer may be formed and a second electrode may be formed on the passivation layer.

For example, the array substrate may be in a variety of types, and the corresponding thin film transistor may be a bottom-gate thin film transistor, a top-gate thin film transistor or a double-gate thin film transistor. The first source/drain electrode is the source electrode or the drain electrode of the thin film transistor. The structure of the array substrate formed according to the above manufacturing method is illustrated by an example that the thin film transistor is a bottom-gate thin film transistor.

Figure 3:
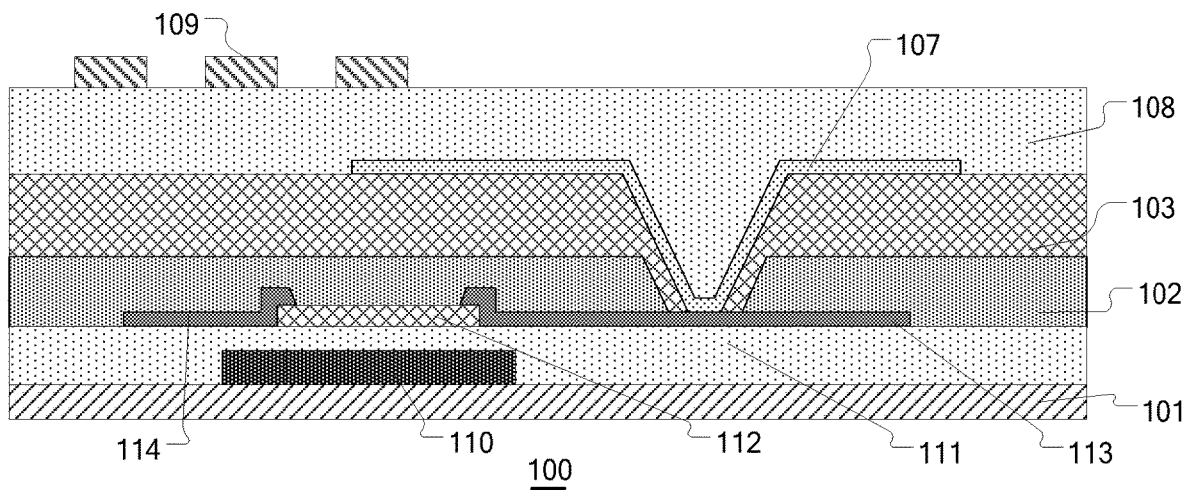
FIG. 3 schematically shows a sectional structure of an array substrate provided by an embodiment of the present disclosure.

For example, FIG. 3 schematically shows a structure of a bottom-gate thin film transistor array substrate provided by an embodiment of the present disclosure. The thin film transistor array substrate 100 comprises: a gate electrode 110, a gate insulating layer 111, an active layer 112, a first source/drain electrode 113, a second source/drain electrode 114, an insulating layer (including an inorganic insulating layer 102 and an organic insulating layer 103) formed on a base substrate 101; a first electrode 107 formed on the organic insulating layer 103 and a passivation layer 108 arranged on the first electrode 107 and a second electrode 109 formed on the passivation layer 108. The first electrode 107 is electrically connected with the first source/drain electrode 113 by the via hole structure formed in the insulating layer (including the inorganic insulating layer 102 and the organic insulating layer 103).

For example, in FIG. 3, the first electrode 107 is a pixel electrode, and the second electrode 109 is a common electrode, thereby forming an ADS (advanced super dimension switch) type array substrate.

In the above example, the pixel electrode is formed under the passivation layer, and the common electrode is formed above the passivation layer. However, the common electrode may be formed under the passivation layer, and the pixel electrode may be formed above the passivation layer. That is, the position relationship of the pixel electrode and the passivation layer can be changed, which is omitted herein.

For example, in another embodiment, a pixel electrode and a common electrode may be formed on an organic layer and covered by a passivation layer. That is, the first electrode includes both the pixel electrode and the common electrode, and the pixel electrode and the common electrode are alternately arranged. As such, there is no need to form the second electrode on the passivation layer. The pixel electrode and the common electrode are formed together on the organic layer and covered by the passivation layer, thereby forming an IPS (in-plane switching) type array substrate.

Figure 4:
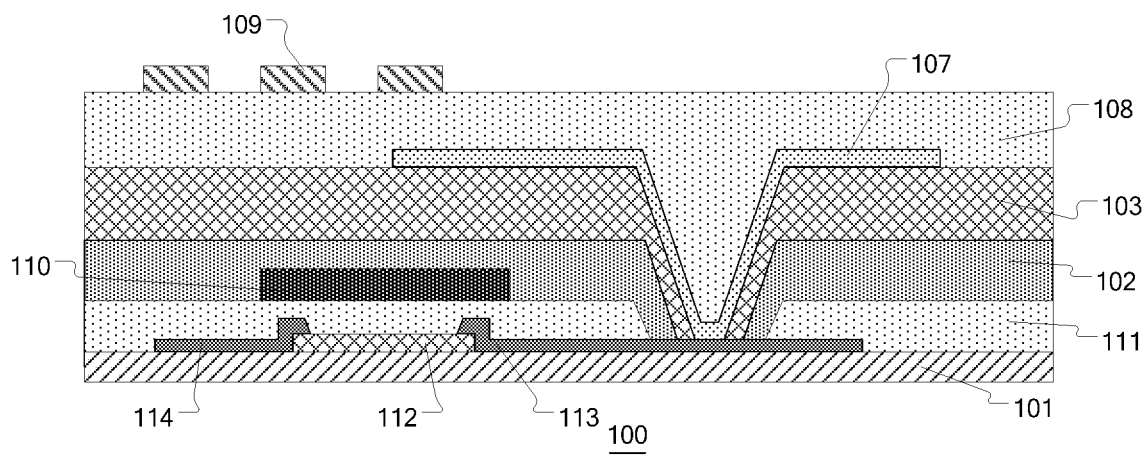
FIG. 4 schematically shows a sectional structure of another array substrate provided by an embodiment of the present disclosure.

For example, the thin film transistor in the thin film transistor array substrate may be a top-gate thin film transistor. For example, FIG. 4 schematically shows a structure of a top-gate thin film transistor array substrate provided by an embodiment of the present disclosure. The thin film transistor array substrate 100 comprises: an active layer 112, a first source/drain electrode 113, a second source/drain electrode 114, a gate insulating layer 111, a gate electrode 110, an insulating layer (including an inorganic insulating layer 102 and an organic insulating layer 103) which are formed on a base substrate 101; a first electrode 107 formed on the organic insulating layer 103, a passivation layer 108 arranged on the first electrode 107, and a second electrode 109 arranged on the passivation layer 108. The first electrode 107 is electrically connected with the first source/drain electrode 113 by the via hole structure formed in the insulating layer (including the inorganic insulating layer 102 and the organic insulating layer 103). The difference between FIG. 4 and FIG. 3 is that the gate electrode 110 in FIG. 4 is arranged on the active layer 112.

For example, similar to the bottom-gate thin film transistor array substrate, the first electrode may be a common electrode, and the second electrode may be a pixel electrode, which is omitted herein.

For example, similar to the bottom-gate thin film transistor array substrate, the first electrode may comprise both the pixel electrode and the common electrode, and the pixel electrode and the common electrode are alternately arranged. As such, there is no need to form a second electrode on the passivation layer.

For example, the double-gate thin film transistor array substrate may differ from the bottom-gate thin film transistor array substrate in that another gate electrode is formed on the first source/drain electrode and the second source/drain electrode, and its other structures are similar to the bottom-gate thin film transistor array substrate, which are omitted herein.

The array substrate formed by the above method can reduce or eliminate the phenomenon of photoresist residue, which improves the display effect of the display device based on the array substrate.

For example, FIG. 5a to FIG. 5i show process diagrams of the manufacturing method of the array substrate provided by an embodiment of the present disclosure, and the structure of the array substrate is illustrated by the example that the thin film transistor is a bottom-gate thin film transistor.

Figure 5A:
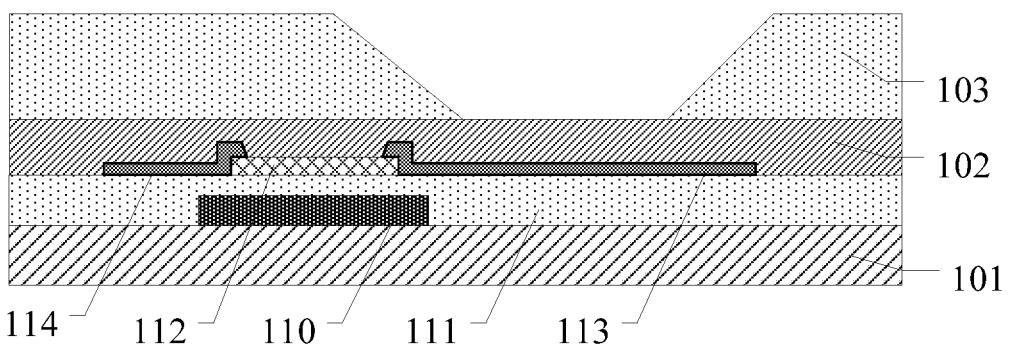
FIG. 5a to FIG. 5i show process diagrams of a manufacturing method of an array substrate provided by an embodiment of the present disclosure.

As illustrated in FIG. 5a, an active layer 112, a first source/drain electrode 113, a second source/drain electrode 114, a gate insulating layer 111, a gate electrode 110 and an insulating layer (including an inorganic insulating layer 102 and an organic insulating layer 103) are formed on a base substrate 101, and a first opening is formed in the organic insulating layer 103.

For example, the gate electrode may be of aluminum (Al), copper (Cu), molybdenum (Mo), chromium (Cr), aluminum copper alloy (AlCu), copper molybdenum alloy (CuMo), molybdenum aluminum alloy (MoAl), aluminum chromium alloy (AlCr), copper chromium alloy (CuCr), molybdenum chromium alloy (MoCr), or copper molybdenum aluminum alloy (CuMoAl), and so on.

For example, the gate insulating layer may be of silicon oxide ($SiO_x$), silicon oxynitride ($SiNO_x$) or silicon nitride ($SiN_x$).

For example, the active layer of the thin film transistor is an oxide semiconductor layer, an amorphous silicon semiconductor layer, a poly-silicon semiconductor layer or an organic semiconductor layer.

For example, an etching barrier may be formed between the active layer and the source/drain electrode. The material of the etching barrier may be silicon oxide ($SiO_x$), silicon oxynitride ($SiNO_x$), or silicon nitride ($SiN_x$) and so on.

Figure 5B:
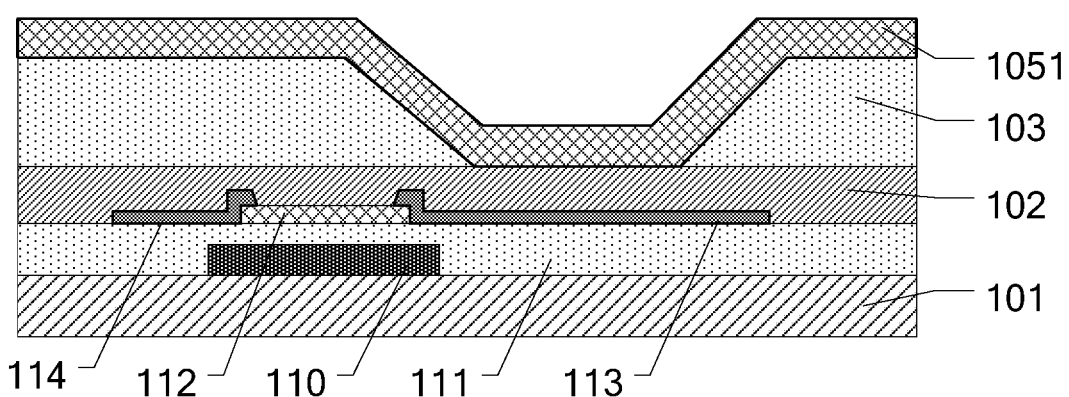

As illustrated in FIG. 5b, the photolithography auxiliary film 1051 is formed on the organic insulating layer 103. For example, the photolithography auxiliary film 1051 may have a thickness of 10 nm to 100 nm. For instance, the thickness of the photolithography auxiliary film 1051 is 20 nm, 40 nm, 60 nm, 80 nm or 100 nm. For example, the photolithography auxiliary film 1051 is applied by heating steam and gasifying with nitrogen.

Figure 5C:
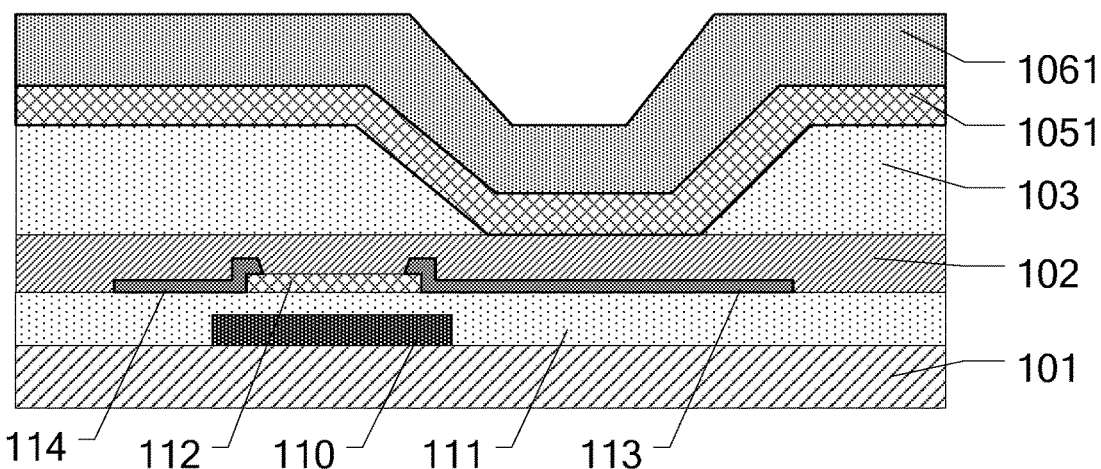

As illustrated in FIG. 5c, a positive photoresist film 1061 is applied on the photolithography auxiliary film 1051. It should be explained that, if a negative photoresist is used, the photoresist pattern would be solidified after irradiating the photoresist by the UV light, and the stripping solution can't reach the auxiliary stripping layer when the stripping solution is used for stripping, so it is difficult to peel the photoresist off. If a positive photoresist is used, in the patterning process to form the photoresist pattern, only the portion of the auxiliary stripping layer at which an opening needs to be formed subsequently is removed by a reaction with the developing solution, and the other portions of the auxiliary stripping layer are not affected.

Figure 5D:
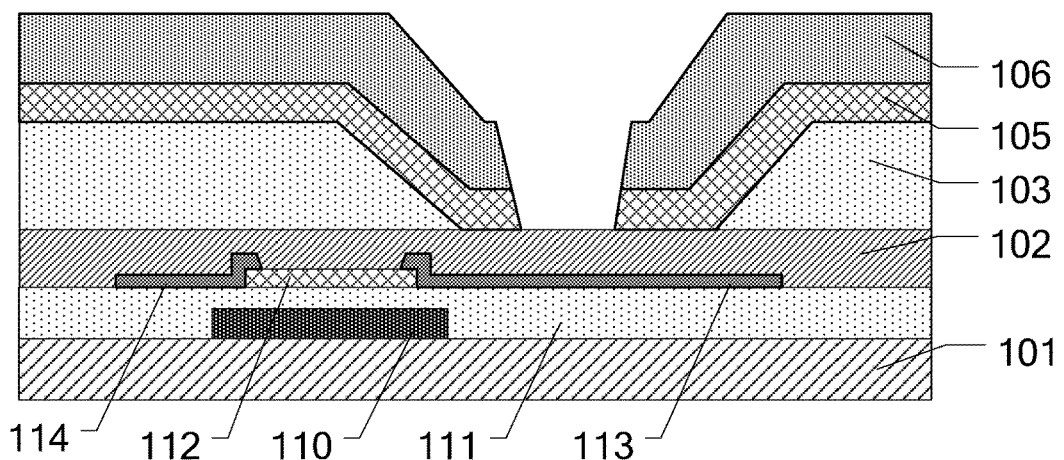

As illustrated in FIG. 5d, the photolithography auxiliary film 1051 and the positive photoresist film 1061 are exposed and developed to remove the exposed and developed portion of the photolithography auxiliary film and the positive photoresist film, thereby forming a pattern of the photolithography auxiliary layer 105 and the positive photoresist 106. For example, the pattern of the photolithography auxiliary layer 105 and the positive photoresist 106 includes a second opening formed in the photolithography auxiliary layer 105 and the positive photoresist 106.

Figure 5E:
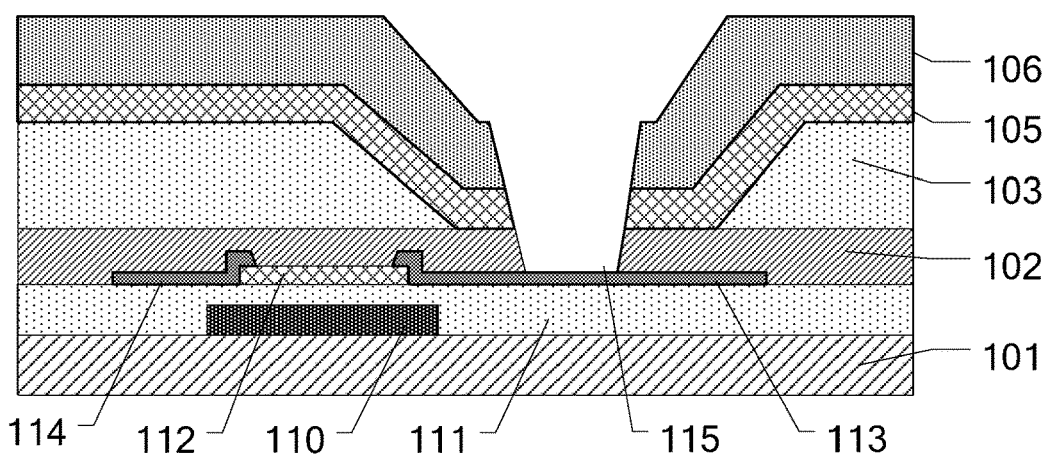

As illustrated in FIG. 5e, the inorganic insulating layer 102 is patterned by using the photolithography auxiliary layer 105 and the positive photoresist 106 as a mask to form a via hole structure 115. The via hole structure 115 and the second opening form a through hole.

Figure 5F:
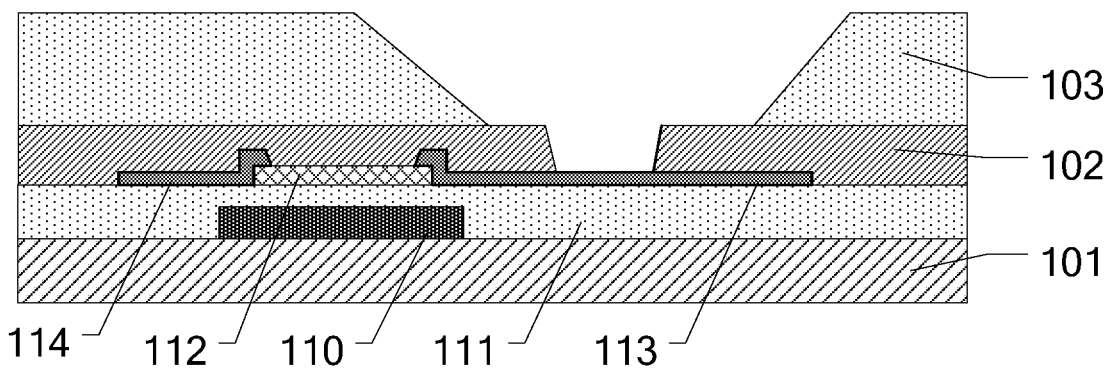

It should be noted that, in this step, the via hole structure may be formed in an organic insulating layer or in a composite insulating layer, which is not limited herein. As illustrated in FIG. 5f, the photolithographic auxiliary layer and the positive photoresist are removed after being irradiated by the UV light. As the polarity of the photolithography auxiliary layer changes, the adhesion between the photolithography auxiliary layer and the insulating layer (for example, the organic insulating layer 103) becomes weakened, which is beneficial for the positive photoresist on the photolithographic auxiliary layer to be stripped.

Figure 5G:
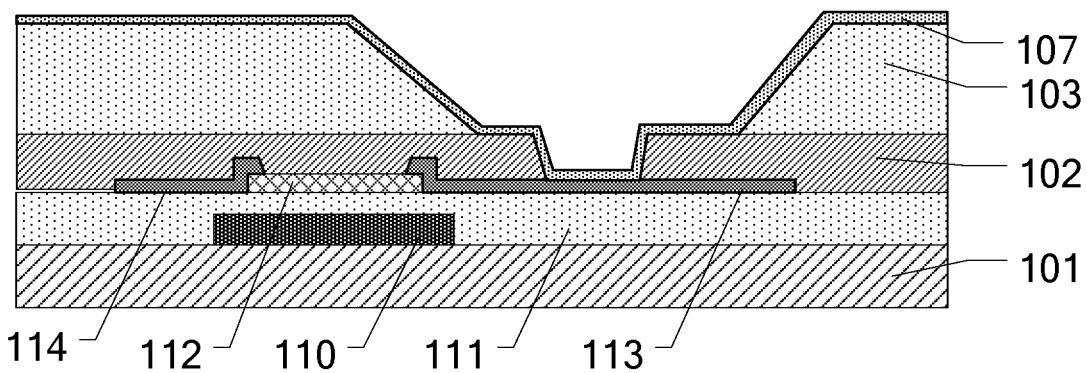

As illustrated in FIG. 5g, a pattern of a first electrode 107 is formed on the insulating layer after the photolithography auxiliary layer and the positive photoresist are stripped, and the first electrode 107 is electrically connected to the first source/drain electrode 113 (a source electrode or a drain electrode) of the thin film transistor by the via hole structure 115. For example, the first electrode may be a transparent conductive layer comprising a material such as ITO (indium tin oxide), IZO (indium zinc oxide), IGZO (indium gallium zinc oxide), a conductive resin, a graphene film, or a carbon nanotube film.

Figure 5H:
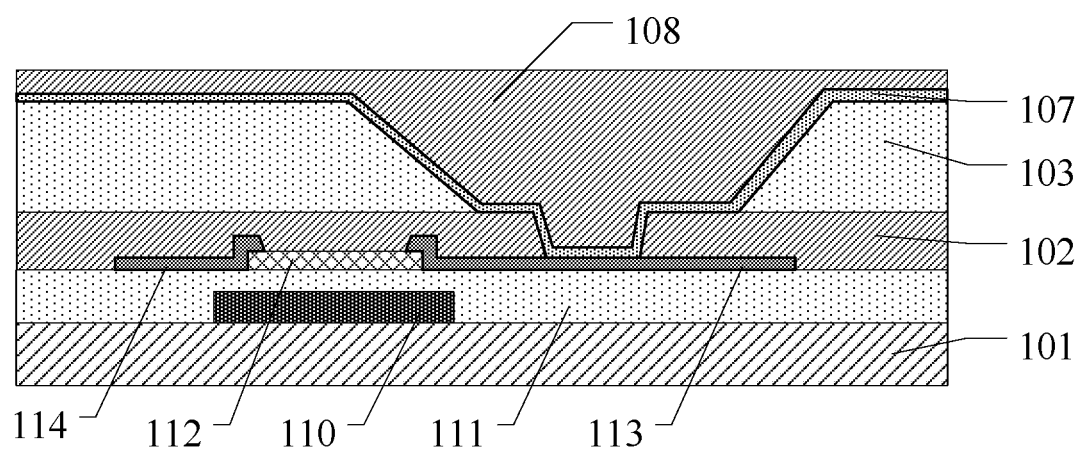

As illustrated in FIG. 5h, a passivation layer 108 is formed on the first electrode. For example, the passivation layer 108 may be made of silicon oxide ($SiO_x$), silicon oxynitride ($SiNO_x$) or silicon nitride ($SiN_x$) and so on.

Figure 5I:
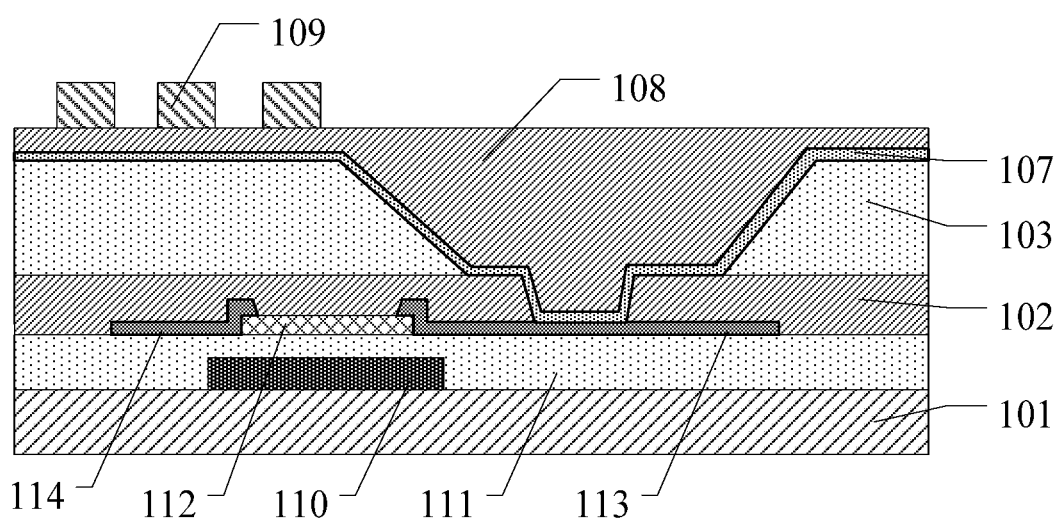

As illustrated in FIG. 5i, a second electrode 109 is formed on the passivation layer 108. For example, the second electrode 109 may be a transparent conductive layer comprising a material such as ITO (indium tin oxide), IZO (indium zinc oxide), IGZO (indium gallium zinc oxide), a conductive resin, a graphene film, or a carbon nanotube film.

The array substrate formed by the above-mentioned method can be applied in various display devices. For example, the display device is: a liquid crystal display panel, an electronic paper, an organic light-emitting diode (OLED) panel, a mobile phone, a tablet computer, a television, a display, a notebook computer, a digital picture frame, a navigation system or any other product or component having a display function.

A patterning method and a method for manufacturing an array substrate provided by at least one embodiment have at least one of the following beneficial effects:

(1) In the patterning method provided by at least one embodiment of the present disclosure, the photoresist auxiliary layer pattern is designed to avoid the residue of the photoresist. That is, the photolithography auxiliary film is applied before applying the photoresist, and the UV illumination unit is added to change the adhesion between the photolithography auxiliary layer pattern and the layer to be patterned before the photoresist is stripped by using a stripping solution. In this way, the photolithography auxiliary layer can be stripped easily, which promotes the positive photoresist to be stripped easily.

(2) In the method for manufacturing the array substrate provided by at least one embodiment of the present disclosure, the yield of the array substrate is improved, and the display quality of the display device such as LCD, LED and OLED based on the array substrate is improved.

Please note that:

(1) the drawings of the embodiments of the present disclosure are only related to the structures mentioned in the embodiments of the present disclosure, and other structures can be further obtained by general designs;

(2) for the sake of clarity, sizes of layers or regions in the drawings for describing the embodiments of the present disclosure are not drawn according to an actual scale but are exaggerated or diminished; and (3) the embodiments of the present disclosure and the features therein can be combined with each other in the absence of conflict.

What are described above is related to only the illustrative embodiments of the disclosure and not limitative to the scope of the disclosure. The scope of the disclosure is defined by the accompanying claims.

What is claimed is:

1. A patterning method, comprising:
forming a photolithography auxiliary film and a positive photoresist film in turn on a base substrate provided with a layer to be patterned;
subjecting the photolithography auxiliary film and the positive photoresist film to a photolithography process to form a photolithography auxiliary layer pattern and a positive photoresist pattern;
patterning the layer to be patterned through the photolithography auxiliary layer pattern and the positive photoresist pattern; and
reducing adhesion between the photolithography auxiliary layer pattern and the layer to be patterned by UV irradiating the photolithography auxiliary layer pattern and the positive photoresist pattern, and then removing the photolithography auxiliary layer pattern and the positive photoresist pattern,
wherein the photolithography auxiliary film is formed by an evaporation process.

2. The patterning method according to claim 1, wherein the photolithography auxiliary layer pattern and the positive photoresist pattern have a same shape.

3. The patterning method according to claim 1, wherein the layer to be patterned is an inorganic insulating layer, an organic insulating layer or a composite insulating layer, and the composite insulating layer comprises an inorganic insulating layer and an organic insulating layer formed sequentially on the base substrate.

4. The patterning method according to claim 1, wherein the photolithography process comprises exposing and developing the photolithography auxiliary film and the positive photoresist film to remove exposed portions of the photolithography auxiliary film and the positive photoresist film.

5. The patterning method according to claim 1, wherein the photolithography auxiliary layer pattern comprises at least one material of:

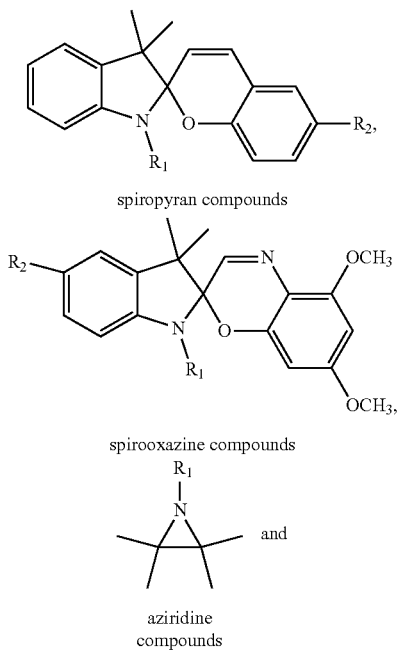

spiropyran compounds spirooxazine compounds aziridine compounds and

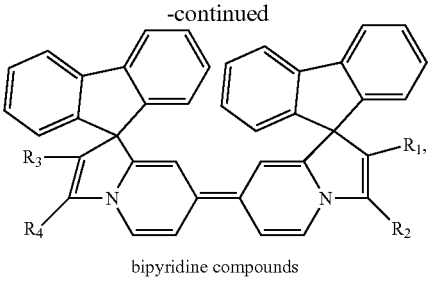

bipyridine compounds wherein $R_1$ and $R_3$ are independently propyl, butyl, amyl, hexyl, phenyl or an ether chain; $R_2$ and $R_4$ are independently carboxyl or hydroxyl.

6. The patterning method according to claim 5, wherein:

the spiropyran compounds are subjected to a following reaction under UV light to reduce adhesion between the photolithography auxiliary layer pattern and the layer to be patterned:

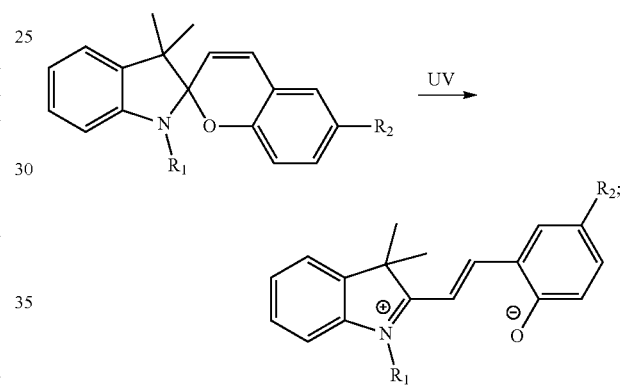

the spirooxazine compounds are subjected to a following reaction under UV light to reduce adhesion between the photolithography auxiliary layer pattern and the layer to be patterned:

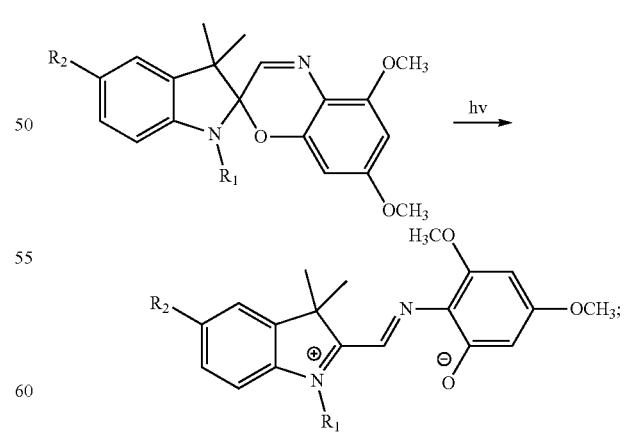

the aziridine compounds are subjected to a following reaction under UV light to reduce adhesion between the photolithography auxiliary layer pattern and the layer to be patterned:

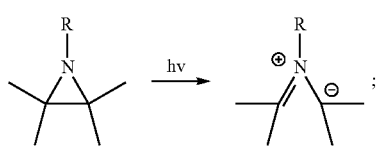

the bipyridine compounds are subjected to a following reaction under UV light to reduce adhesion between the photolithography auxiliary layer pattern and the layer to be patterned:

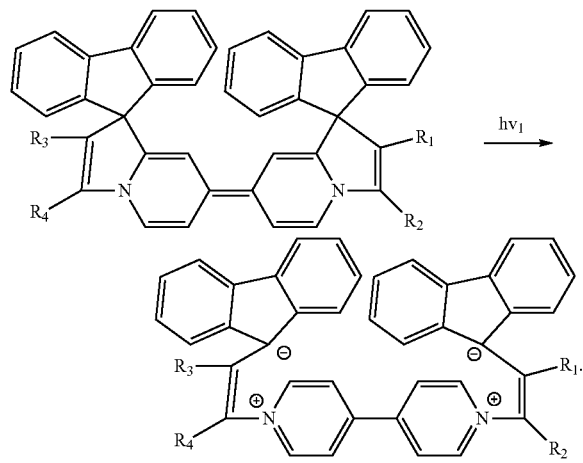

7. The patterning method according to claim 5, wherein the photolithography auxiliary layer pattern comprises a material of N-butyl-6-hydroxyl spiropyran

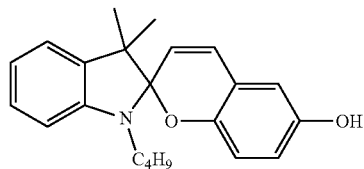

or N-butyl-5'-carboxyl-5,7-dimethoxy-spirobenzoxazine

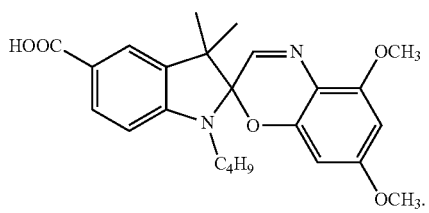

8. The patterning method according to claim 2, wherein the patterning the layer to be patterned comprises forming a via hole structure in the layer to be patterned by a plasma dry etching process.

9. The patterning method according to claim 3, wherein the organic insulating layer is made from a mixture of 10 wt % to 20 wt % of polymethyl methacrylate resin, 1 wt % to 5 wt % of an unsaturated monomer molecule, 0.1 wt % to 1 wt % of a photoinitiator, 0.1 wt % to 1 wt % of an additive(s), and 75 wt % to 90 wt % of an organic solvent.

10. The patterning method according to claim 1, wherein UV light employed to irradiate the photolithography auxiliary layer pattern and the positive photoresist pattern has an intensity of 1 mW/cm$^2$ to 10 mW/cm$^2$.

11. The patterning method according to claim 1, wherein the removing the photolithography auxiliary layer pattern and the positive photoresist pattern is achieved by a stripping solution which comprises 10 wt % to 30 wt % of monoethanolamine (MEA), 40 wt % to 70 wt % of diethylene glycol monobutyl ether, and 10 wt % to 40 wt % of dimethyl sulfoxide (DMSO).

12. The patterning method according to claim 1, wherein the positive photoresist pattern is made from a mixture of 5 wt % to 30 wt % of phenolic resin, 2 wt % to 5 wt % of a diazonaphthaquinone photosensitizer, 0.1 wt % to 1 wt % of an additive(s), and 65 wt % to 80 wt % of an organic solvent.

13. A method for manufacturing an array substrate, comprising:
forming a photolithography auxiliary film and a positive photoresist film in turn on a base substrate provided with a layer to be patterned;
subjecting the photolithography auxiliary film and the positive photoresist film to a photolithography process to form a photolithography auxiliary layer pattern and a positive photoresist pattern;
patterning the layer to be patterned through the photolithography auxiliary layer pattern and the positive photoresist pattern; and
reducing adhesion between the photolithography auxiliary layer pattern and the layer to be patterned by UV irradiating the photolithography auxiliary layer pattern and the positive photoresist pattern, and then removing the photolithography auxiliary layer pattern and the positive photoresist pattern,
wherein the photolithography auxiliary film is formed by an evaporation process.

14. The method for manufacturing according to claim 13, wherein the photolithography auxiliary layer pattern comprises at least one material of:

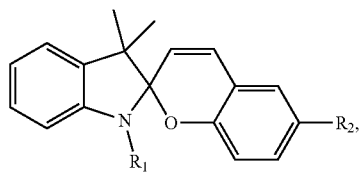

spiropyran compounds

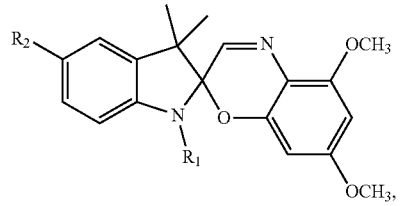

spirooxazine compounds

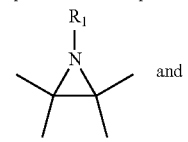

and aziridine compounds

-continued

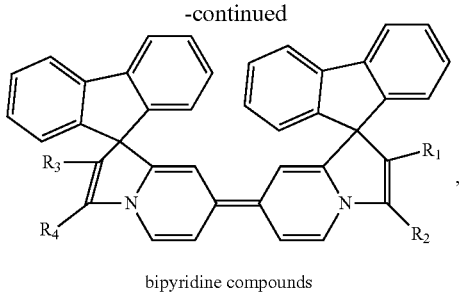
bipyridine compounds wherein $R_1$ and $R_3$ are independently propyl, butyl, amyl, hexyl, phenyl or an ether chain; $R_2$ and $R_4$ are independently carboxyl or hydroxyl.

15. The method for manufacturing according to claim 14, wherein:
the spiropyran compounds are subjected to a following reaction under UV light to reduce adhesion between the photolithography auxiliary layer pattern and the layer to be patterned:

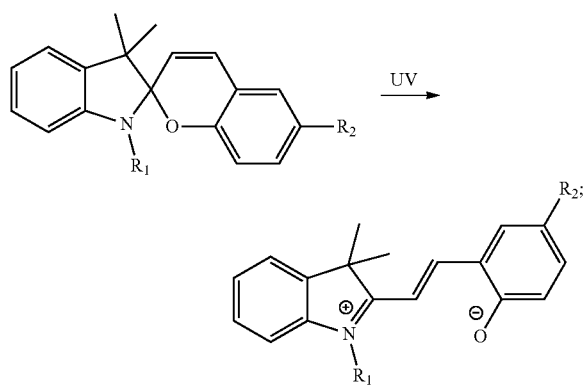

the spirooxazine compounds are subjected to a following reaction under UV light to reduce adhesion between the photolithography auxiliary layer pattern and the layer to be patterned:

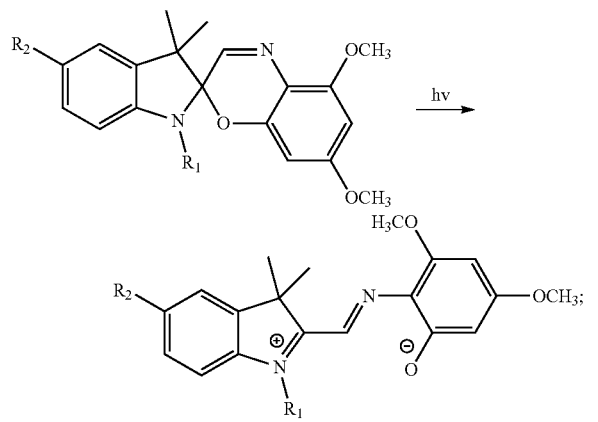

the aziridine compounds are subjected to a following reaction under UV light to reduce adhesion between the photolithography auxiliary layer pattern and the layer to be patterned:

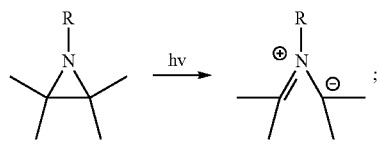

the bipyridine compounds are subjected to a following reaction under UV light to reduce adhesion between the photolithography auxiliary layer pattern and the layer to be patterned:

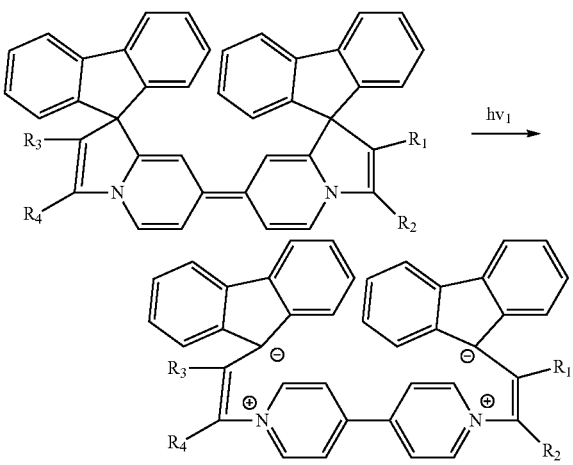

16. The method for manufacturing according to claim 15, wherein the photolithography auxiliary layer pattern comprises a material of N-butyl-6-hydroxyl spiropyran

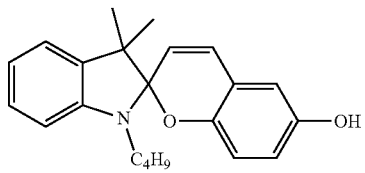

or N-butyl-5'-carboxyl-5,7-dimethoxy-spirobenzoxazine

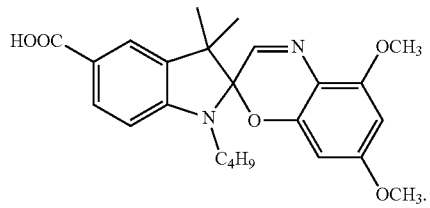

17. The method for manufacturing according to claim 13, wherein the patterning the layer to be patterned comprises forming a via hole structure in the layer to be patterned by a plasma dry etching process.

18. The method for manufacturing according to claim 17, further comprising: forming a first electrode on the layer to be patterned after the photolithography auxiliary layer pattern and the positive photoresist pattern have been removed.

19. The method for manufacturing according to claim 18, further comprising: forming a thin film transistor on the base substrate before providing the base substrate with the layer to be patterned, wherein the thin film transistor comprises a first source drain electrode which is electrically connected with the first electrode by the via hole structure.

* * * * *